(12) United States Patent
Kohyama

(10) Patent No.: US 8,133,753 B2
(45) Date of Patent: Mar. 13, 2012

(54) SOLID-STATE IMAGE PICKUP DEVICE AND METHOD FOR MANUFACTURING SAME

(75) Inventor: Yusuke Kohyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/166,441

(22) Filed: Jun. 22, 2011

(65) Prior Publication Data

US 2011/0250716 A1  Oct. 13, 2011

Related U.S. Application Data

(62) Division of application No. 12/486,244, filed on Jun. 17, 2009, now Pat. No. 8,039,883.

(30) Foreign Application Priority Data

Jun. 20, 2008 (JP) ................... 2008-162359

(51) Int. Cl.
*H01L 21/00* (2006.01)

(52) U.S. Cl. ............... 438/65; 438/66; 438/69; 438/67; 438/48

(58) Field of Classification Search .................. 438/65, 438/66, 67, 69, 48
See application file for complete search history.

(56) References Cited

U.S. PATENT DOCUMENTS

| | | | |
|---|---|---|---|
| 6,806,522 B2 * | 10/2004 | Ohkubo | 257/292 |
| 6,821,809 B2 | 11/2004 | Abe et al. | |
| 7,411,170 B2 * | 8/2008 | Shimotsusa et al. | 250/208.1 |
| 7,646,047 B2 * | 1/2010 | Maruyama et al. | 257/291 |
| 7,675,099 B2 | 3/2010 | Hwang et al. | |
| 7,709,969 B2 | 5/2010 | Yamamoto et al. | |
| 2006/0146233 A1 * | 7/2006 | Park | 349/95 |
| 2008/0054165 A1 | 3/2008 | Shimotsusa et al. | |
| 2008/0142856 A1 | 6/2008 | Sato et al. | |

OTHER PUBLICATIONS

Yasushi Maruyama, et al. "A back-illuminated high-sensitivity small-pixel color CMOS image sensor with flexible layout of metal wiring", ITE Technical Report vol. 30, No. 25, IST2006-14, CE2006-43(Mar. 2006) 4 pages (with English Abstract).

* cited by examiner

*Primary Examiner* — Luan C Thai
(74) *Attorney, Agent, or Firm* — Oblon, Spivak, McClelland, Maier & Neustadt, L.L.P.

(57) ABSTRACT

In a solid-state image pick up device, a first conduction type semiconductor layer which has a first surface side. A second surface side which is located the opposite side of the first surface side and an image sensor area. A photo-conversion area which is configured in the first surface side and charges electron by photoelectric conversion. A first diffusion area of second conduction type for isolation, wherein the first diffusion area surrounds the photo-conversion area and extends from the first surface side to the middle part of the semiconductor layer and a second diffusion area of second conduction type for isolation, wherein the second diffusion area extends from the second surface side to the bottom of the first diffusion layer.

8 Claims, 14 Drawing Sheets

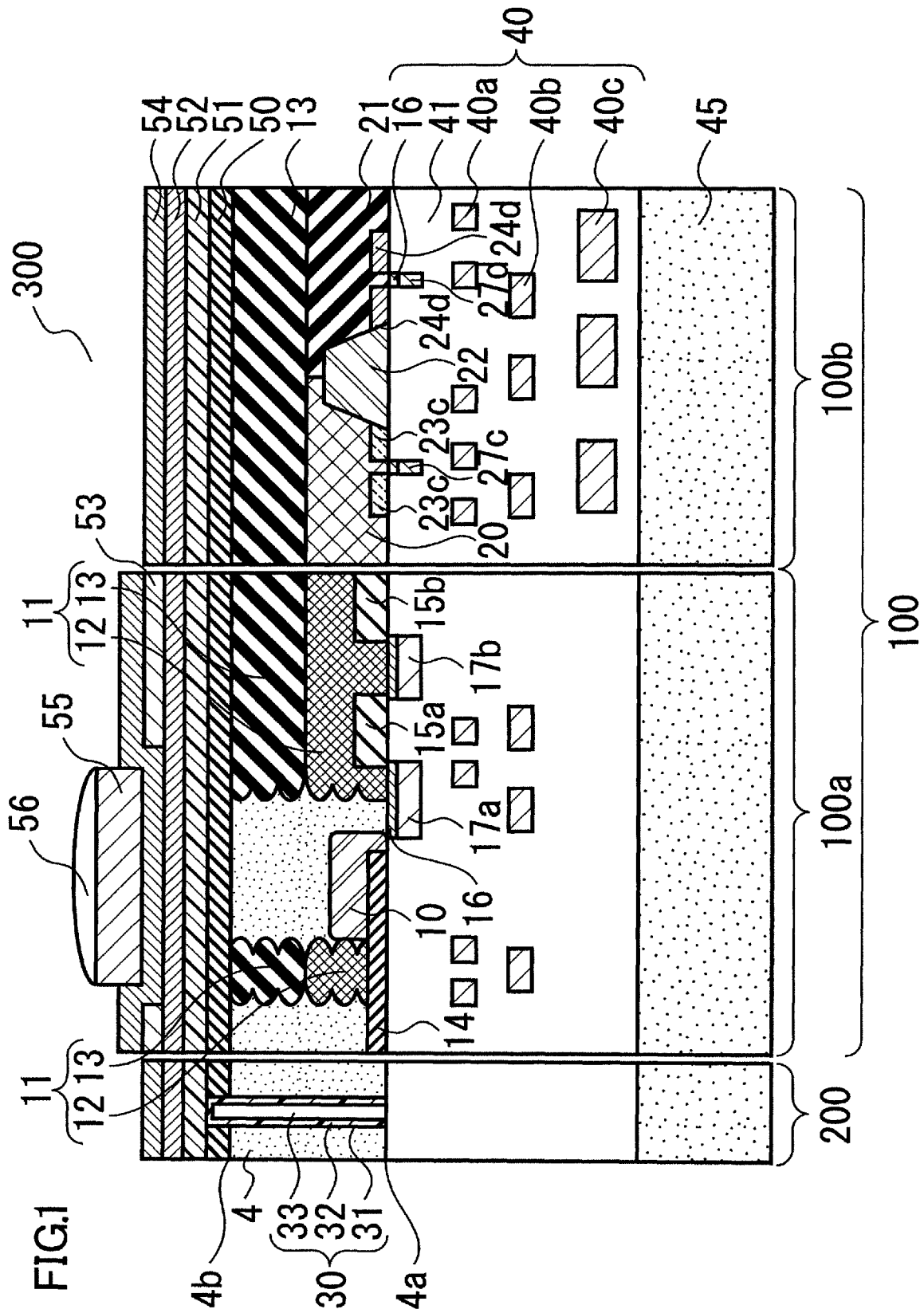

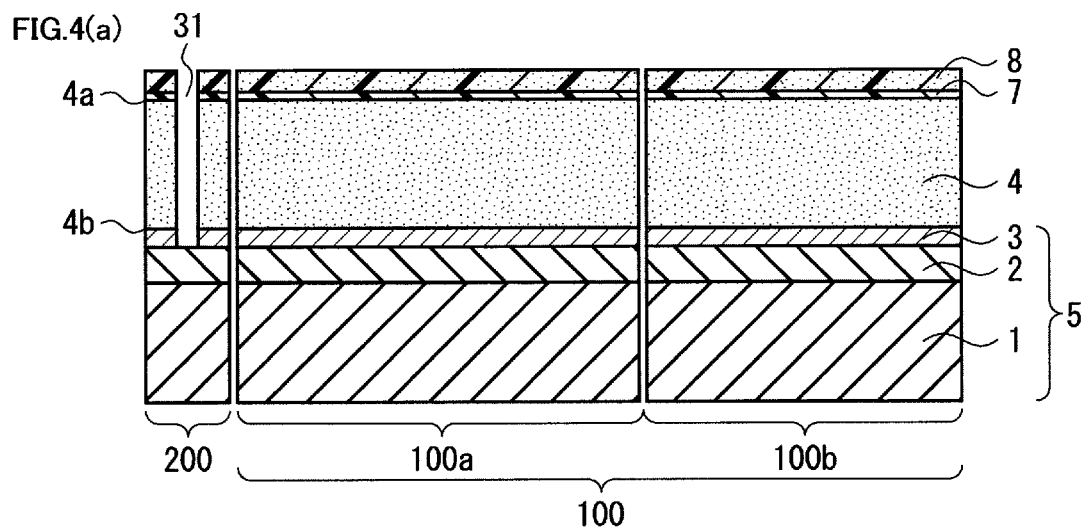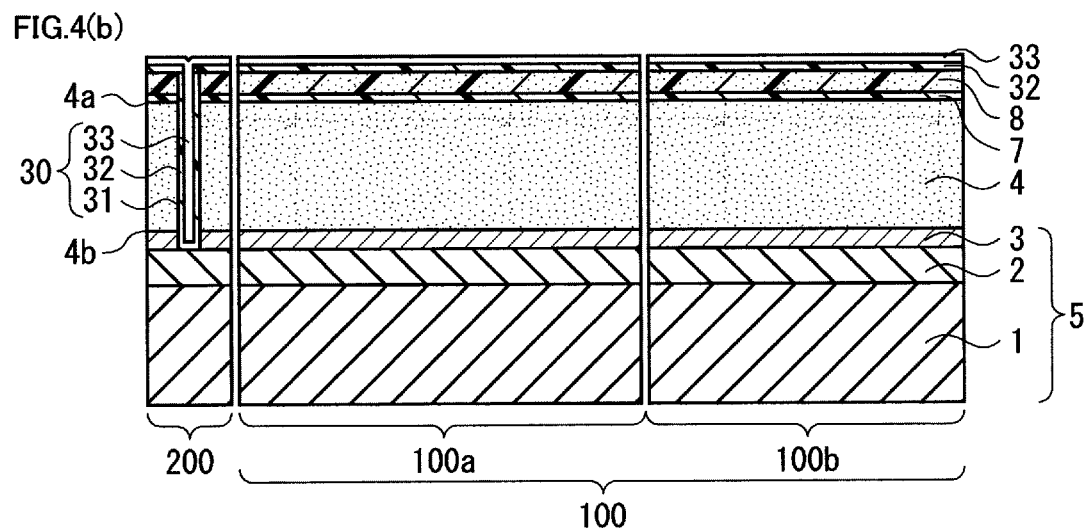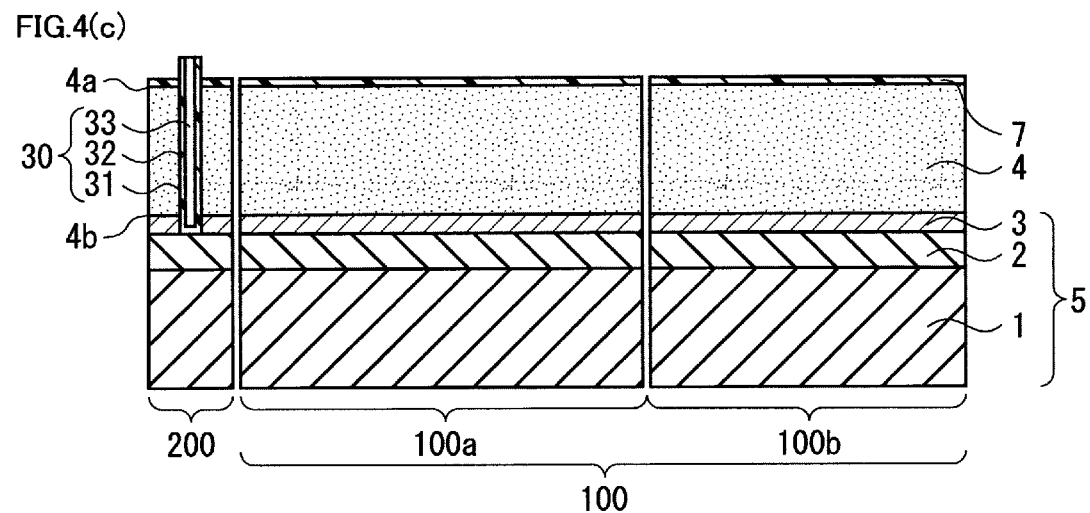

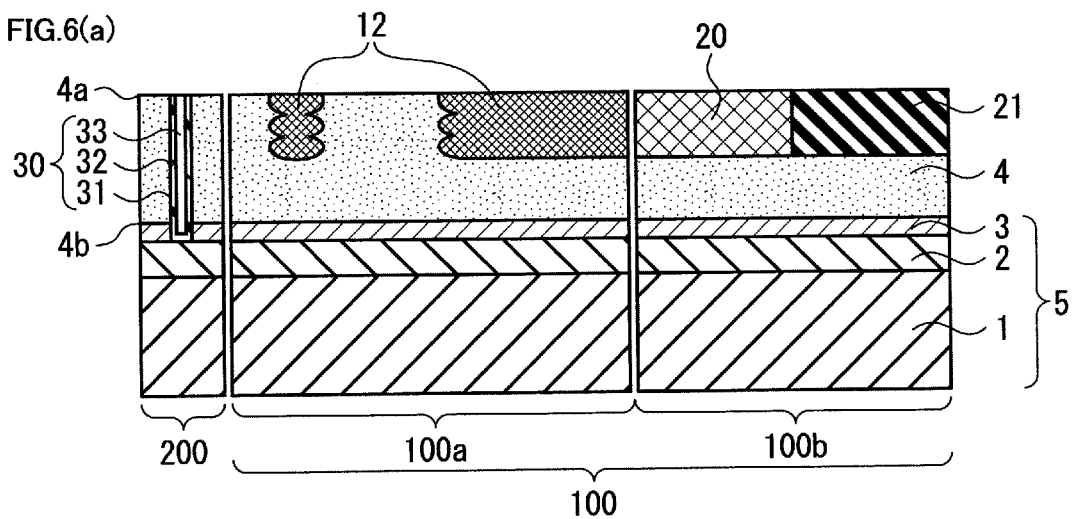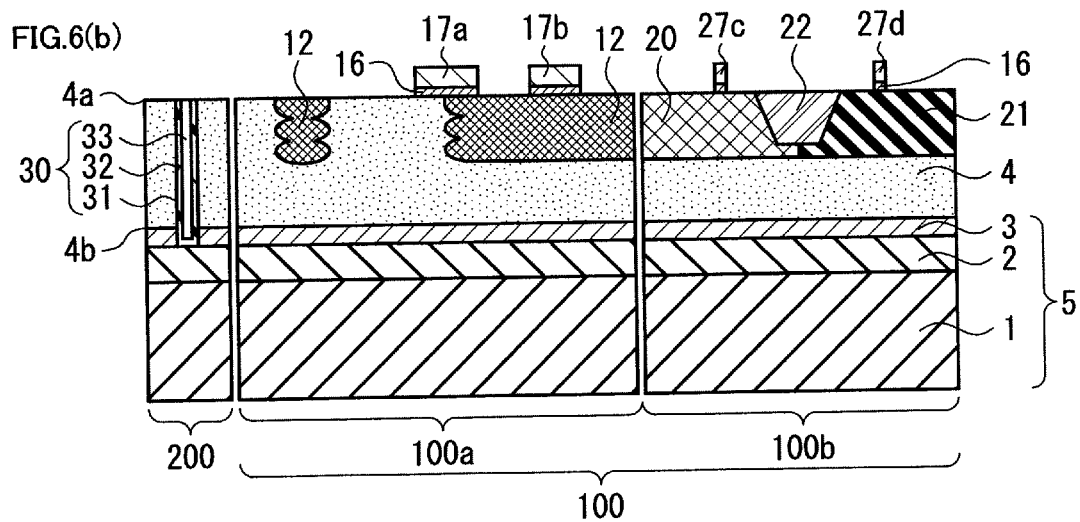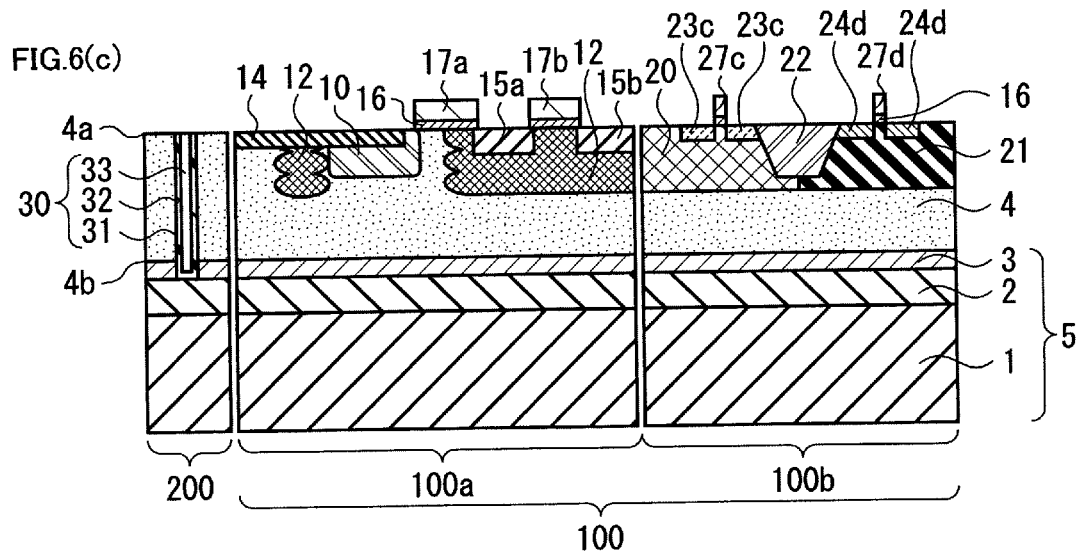

SOLID-STATE IMAGE PICKUP DEVICE AND METHOD FOR MANUFACTURING SAME

CROSS-REFERENCE TO RELATED APPLICATIONS

This application is a divisional of U.S. application Ser. No. 12/486,244 filed on Jun. 17, 2009, and is based upon and claims the benefit of priority from prior Japanese Patent Application No. 2008-162359, filed on Jun. 20, 2008; the entire contents of each of which are incorporated herein by reference.

BACKGROUND OF THE INVENTION

1. Field of the Invention

The present invention relates to a solid-state image pickup device and a method for manufacturing the same 2. Description of the Related Art In recent years, as one of a solid-state image pickup device technology, such as CCD or CMOS image sensor, which raises the device performance, a backside-illuminated solid-state image device which raises sensitivity and advanced shading is reported. (see for example Back irradiation type CMOS image sensor BRIEF SUMMARY (ITE Technical Report Vol. 30, No. 25, PP. 25-28 IST 2006-14, CE 2006-43 (March 2006)))

By using an image sensor as a back-illuminated type, between a micro lens and a photo-conversion area, the optical obstacle is lost and high sensitivity and little optical shading are realized.

Moreover, since the flexibility of the interconnect layout by the side of the surface of an element increases, expensive miniaturization processing technology is avoidable. Furthermore, expansion of a dynamic range can also be enlarged because PN junction area increases.

By the way, irrespective of a back-illuminated type or a surface-illuminated type, when an electron which produced by photoelectric conversion is leakageed in an adjacent photo-conversion area, a crosstalk may be produced. Therefore, it is required to prepare an isolation area between image sensors. Moreover, in order to absorb light certainly especially in a back-illuminated type case, it is necessary to form the photo-conversion area in a deep area of a semiconductor layer for light of red with long wavelength. Generally, the isolation area is formed by high acceleration ion implantation so that the isolation area arrives at from the surface to the back side of the semiconductor layer. Moreover, a photo-conversion area is similarly formed in a deep area of the semiconductor layer by high acceleration ion implantation from a surface of the semiconductor layer.

BRIEF SUMMARY OF THE INVENTION

An aspect of the present invention provides a solid-state image pick up device may comprise a first conduction type semiconductor layer which has a first surface side, a second surface side which is located the opposite side of the first surface side and an image sensor area, a photo-conversion area which is configured in the first surface side and charges electron by photoelectric conversion, a first diffusion area of second conduction type for isolation, wherein the first diffusion area surrounds the photo-conversion area and extends from the first surface side to the middle part of the semiconductor layer, and a second diffusion area of second conduction type for isolation, wherein the second diffusion area extends from the second surface side to the bottom of the first diffusion layer.

Another aspect of the present invention may comprise configuring a photo-conversion area, which charges electron by photoelectric conversion, by implanting from a first surface side of a first conduction type semiconductor layer which has the first surface side, a second surface side which is located the opposite side of the first surface side and an image sensor area, configuring a first diffusion area of second conduction type for isolation, wherein the first diffusion area surrounds the photo-conversion area and extends from the first surface side to the middle part of the semiconductor layer, and configuring a second diffusion area of second conduction type for isolation, wherein the second diffusion area extends from the second surface side to the bottom of the first diffusion layer.

BRIEF DESCRIPTION OF THE DRAWING

FIG. 1 is a sectional view of the solid image pick-up equipment concerning the form according to a first embodiment in the present invention.

FIG. 4 (a), (b), (c) are a sectional view of the solid-state image pick up device manufactured according to a first embodiment in the present invention.

FIG. 6 (a), (b), (c) are a sectional view of the solid-state image pick up device manufactured according to a first embodiment in the present invention.

DETAILED DESCRIPTION OF THE PREFERRED EMBODIMENTS

Figure 2A:
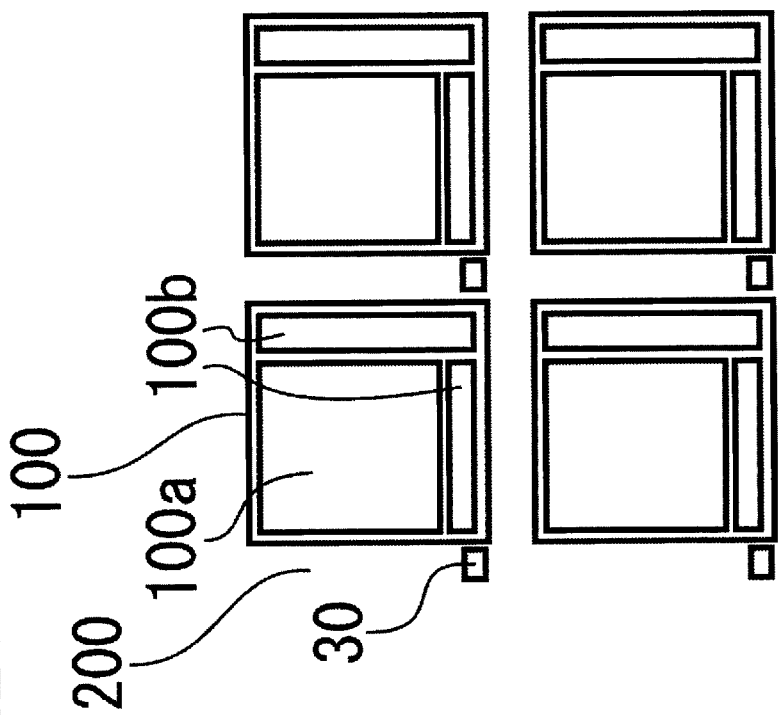
FIG. 2(a), (b) are plane view explaining the position of the alignment mark concerning the form in the present invention.

Hereafter, the form of implementation of this invention is explained with reference to drawings.

First Embodiment

FIG. 1 is a sectional view of the CMOS type solid-state image sensor of the back-illuminated type structure.

As shown in FIG. 1, a solid-state image sensor 300 has N type epitaxial layer (semiconductor layer) 4, and the N type epitaxial layer 4 has a first surface side (surface) 4a and a second surface side (back side) 4b which is located to the opposite side of the first surface side. Moreover, the N type epitaxial layer 4 has a device area 100 and a peripheral area 200.

The device area 100 has an image sensor area 100a and a peripheral circuit area 100b. The first surface side 4a of the N type epitaxial layer 4 of the image sensor area 100a has a photo diode, which comprises a photo-conversion area 10 and a first P type shield layer 14. The photo-conversion area 10 takes in a visible light, converts the light to a signal charge and accumulate the signal charge. The first P type shield layer 14 prevents a following dark current.

In order to surround the photo-conversion area 10, an isolation area 11 is formed. The isolation area 11 is formed in order to reach to the second surface side 4b from the first surface side 4a of N type epitaxial layer 4.
Moreover, the isolation area 11 comprises a first P Type diffusion layer 12 and a second P type diffusion layer 13 which is adjacent to the first P type diffusion layer 12. The first P type diffusion layer 12 is been extended from the first surface side 4a of N type epitaxial layer 4 to the intermediate section of the N type epitaxial layer 4. Moreover, the second P type diffusion layer 13 extends from the second surface side of the N type epitaxial layer 4 and reaches to the bottom (intermediate part of the N type epitaxial layer 4) of the first P type diffusion layer 12.

And the first P type shield layer 14 is configured on the surface of the photo-conversion area part 10 and the surface of first P type diffusion layer 12 which is in one side (the isolation area 11 side) of this photo-conversion area part 10.

Moreover, the source/drain 15a, 15b is mutually alienated on the surface of the first P type diffusion layer 12 of the other side of the photo-conversion area 10 (a side of a transfer gate electrode 17a).
Through a gate insulator film 16, the transfer gate electrode 17a is on the first surface side 4a of the N type epitaxial layer 4 which is between the source/drain 15a and the photo-conversion area 10. And a read-out MOSFET comprises the photo-conversion area 10, the source/drain 15a, 15b and the transfer gate electrode 17a, in order to read out the electric charge which is accumulated to the photo-conversion area 10.

Furthermore, through the gate insulator film 16, a reset gate electrode 17b is on the first surface side 4a of the N type epitaxial layer 4 which is between the source/drain 15a, 15b, in order to reset the electric charge of the photo-conversion area.

On the other hand, P type semiconductor wells 20 and N type semiconductor wells 21 are in the first surface side 4a of the N type epitaxial layer 4 of the peripheral circuits area 100b. An isolation film 22 for isolate is in a boundary section of the P type semiconductor well 20 and the N type semiconductor well 21. A second P type diffusion layer 13 is between these P type semiconductor wells 20, N type semiconductor wells and the second surface side 4b of the N type epitaxial layer 4.

Moreover, NMOSFET for peripheral circuits which comprise a N type source/drain 23c for NMOSFET, a gate insulate film 16 and a gate electrode 27c is in a surface side of the P type wells 20. PMOSFET for peripheral circuits which comprise a P Type source/drain 24d for PMOSFET, a gate insulate film 16 and a gate electrode 27d is in a surface side of the N type wells 21. These P and N type MOSFET are for analog circuits and logic circuits.

An alignment mark 30 is in the peripheral area 200. The alignment mark 30 comprises an etching-resistant film 32 for HF-resistance and a buried layer 33. The etching-resistant film 32 is formed in order to cover a trench 31 which is formed in order to reach to the second surface side 4b from the first surface side 4a of the epitaxial layer 4, an inside of the trench 31 and an opening edge of the second surface side 4b of the N type epitaxial layer 4. The buried layer 33 comprises such as a silicon oxide film which is buried in the trench 31 covered by the etching-resistant layer 32.

Moreover, the interconnect layer 40 is in the first surface side 4a of the N type epitaxial layer 4. For example, the interconnect layer 40 comprises interconnect layer which is formed a first to a third Interconnect layer 40a, 40b, and 40c and interlayer insulation film 41. Moreover, a support substrate 45 is formed on the surface of the other side of the N type epitaxial layer 4 in the interconnect layer 40. The support substrate 45 is for supporting the solid-state image sensor 300.

On the other hand, the second P type shield layer 50 is formed in order to not let escape the signal charge on the second surface side 4b of the N type epitaxial layer 4. An amorphous silicon layer 51 which functions as a gettering site against a metal contamination is formed in the whole surface on the second P type shield layer 50. Furthermore, a first insulated film 52 is formed on a whole surface of the amorphous silicon layer 51.

Moreover, a photo-shielding layer 53 is formed on a part of the first insulated film 51 of the image sensor area 100a. In order to prevent an incidence of the light from other image sensor areas (or outside of a lens), the photo-shielding layer 53 is formed to enclose a periphery of a later lens 56. Furthermore, a second insulated film 54 is formed on the first insulated film 52 and the photo-shielding layer 53 so that the first insulated film 52 and the photo-shielding layer 53 are covered. And a color filter 55 is formed on the second insulated film 54 of the photo-shielding layer 53, and a micro lens 56 is formed on the color filter 55. The color filter 55 and the micro lens 56 are at the position opposed to the photo-conversion area 10.

In the above-mentioned solid-state image sensor 300, the light which enters from the side of micro lens 56, and which is condensed by the micro lens 56, becomes a desired wavelength light through such as the color filter 55, the second insulated film 54 and the first insulated film 52. And the light is accumulated in the photo-conversion area 10 as a signal charge. And the signal charge accumulated in the photo-conversion area 10 is transmitted to the source/drain 15a of a MOSFET for read-out by transmission gate electrode 17a, and the voltage of the source/drain 15a of the MOSFET for read-out is amplified with an amplification transistor (not showing in figures), then, the signal charge is outputted to a peripheral circuit as a pixel signal.

Figure 2B:
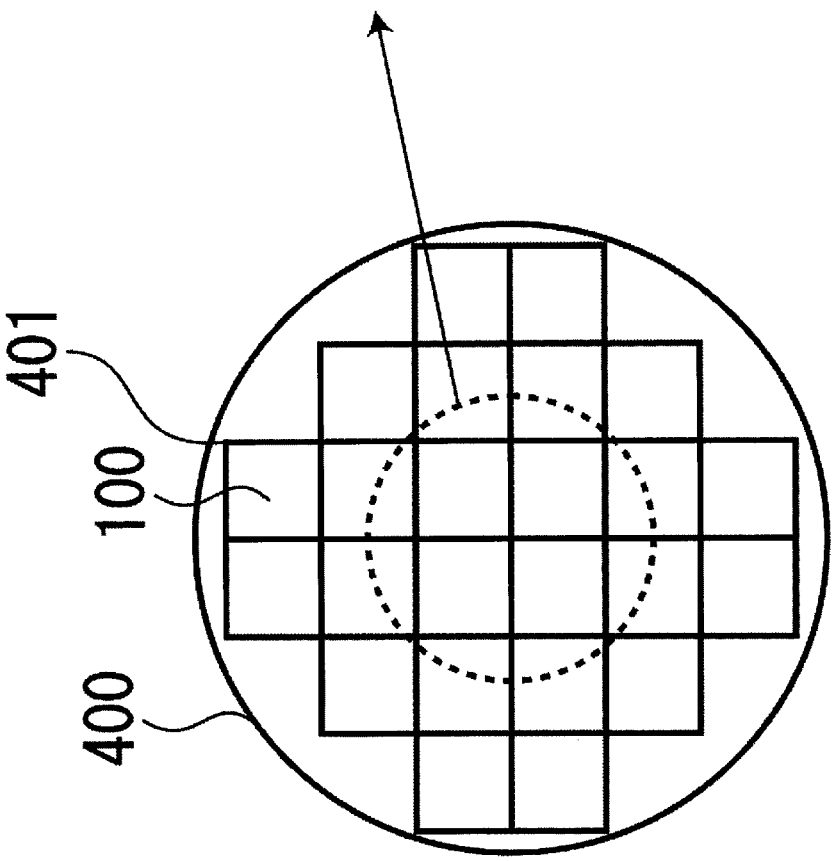

The solid-state image sensor 300 of FIG. 1 has the device area 100 in a lot of chips 401 of a wafer 400 as shown in the plane view of FIGS. 2 (a) and (b). And the alignment mark 30 in the peripheral area 200 is arranged in the predetermined position on the dicing line during each chip 401, for example, between the device areas 100.

Next, a manufacture method of the above-mentioned solid-state image sensor 300 is explained by referring from FIG. 3 to 9.

Figure 3A:
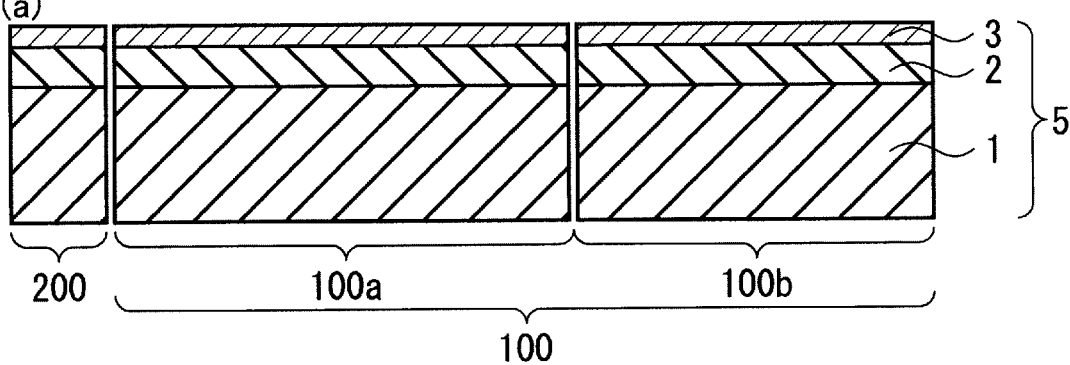
FIG. 3(a), (b), (c) are a sectional view of the solid-state image pick up device manufactured according to a first embodiment in the present invention.
Figure 3B:
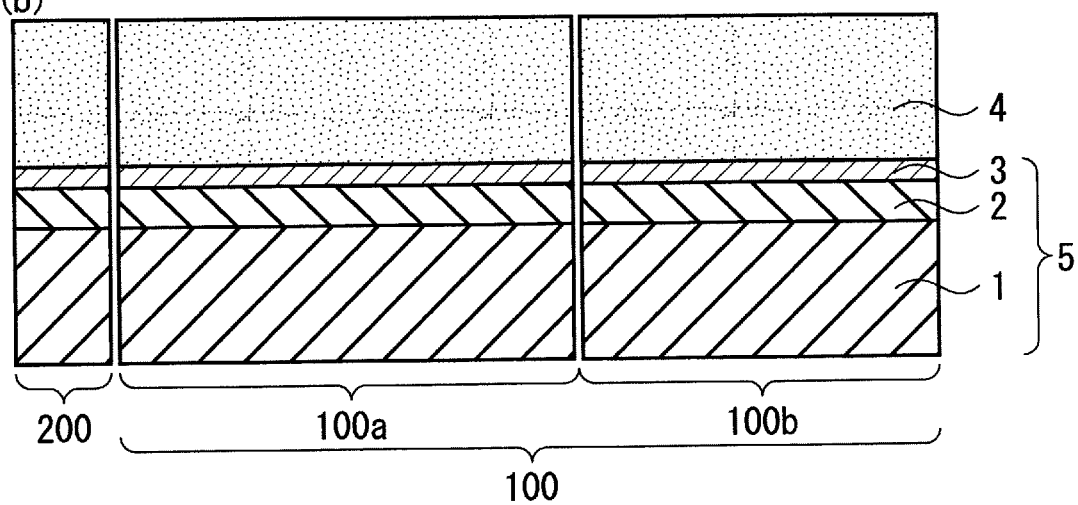

First, as shown in FIG. 3 (a), a SOI substrate 5 which comprises a BOX (Buried Oxide) layer 2 and a SOI (Silicon On Insulator) layer 3 on the semiconductor substrate 1 is prepared. Here, a film thickness of the SOI layer 3 is 50-100 nm, and a density of the SOI layer 3 is 10E15-10E17 cm-3 of N type crystal silicone.

Figure 3C:
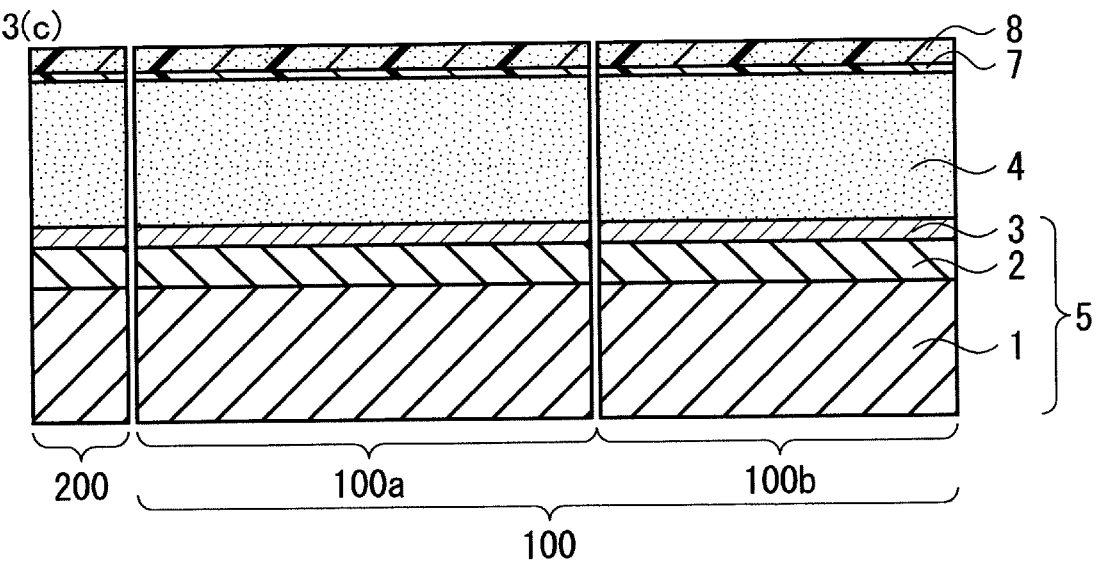

Next, on the whole surface of the SOI layer 3, as shown in FIG. 3 (b), the N type epitaxial layer 4, 3-10 micrometers in thickness and 10E15-10E17 in density, is formed. In addition as shown in FIG. 3(c), a silicon oxide layer 7 and silicon nitride layer 8 are formed on the N type epitaxial layer 4 one by one.

Next, as shown in FIG. 4 (a), using well-known lithography technology and RIE (Reactive Ion Etching) technology, a trench 31 is formed to reach to the BOX layer 2 through the silicon nitride layer 8 and the silicone oxide layer 7. And as shown in FIG. 4(b), the etching-resistant film 32 is formed in order to cover at least an opening edge of the second surface side 4b (a bottom) of the trench 31. And the buried layer 33 such as silicon oxide is buried in trench 31.

Here, the alignment mark 30 which is used for an alignment mark at the time of later lithography process is configured by the trench 31, the etching-resistant film 32, and the buried layer 33. Concretely, the alignment mark 30 is used for correct lithography by using an alignment signal caused by a change of a reflectance in a boundary of the etching-resistant film 32 and the buried layer 33. The etching-resistant film 32 has HF tolerance, and the reflectance of the etching-resistant film 32 is different from buried layer 33. For example, a silicon nitride film etc. is used for the etching-resistant film 32.

The buried layer 33 is desirable silicon oxide, but is not limited to silicon oxide. A material which is recognizable for an alignment mark, in other word, a material which reflectance is different from the etching-resistant film 32 in lithography process is also allowable for the buried layer 32. Furthermore, the burial layer 33 need not be formed in the whole in the trench 31. That is, the buried layer 33 has to be formed at least in the bottom neighborhood of the trench 31. The trench 31 can have hollow except for the bottom neighborhood.

Next, the etching-resistant film 32 and buried layer 33 are removed by flattening such as CMP (Chemical Mechanical Polish) technique. Then, as shown in FIG. 4 (c), the silicon nitride layer 8 is removed by wet-etching, for example by phosphoric acid H3PO4.

Then, an image sensor and a peripheral circuit element are formed on the N type epitaxial layer 4 using a well-known CMOS image sensor process. Hereafter, a CMOS image sensor process is explained with reference to FIG. 5 to 10.

Figure 5A:
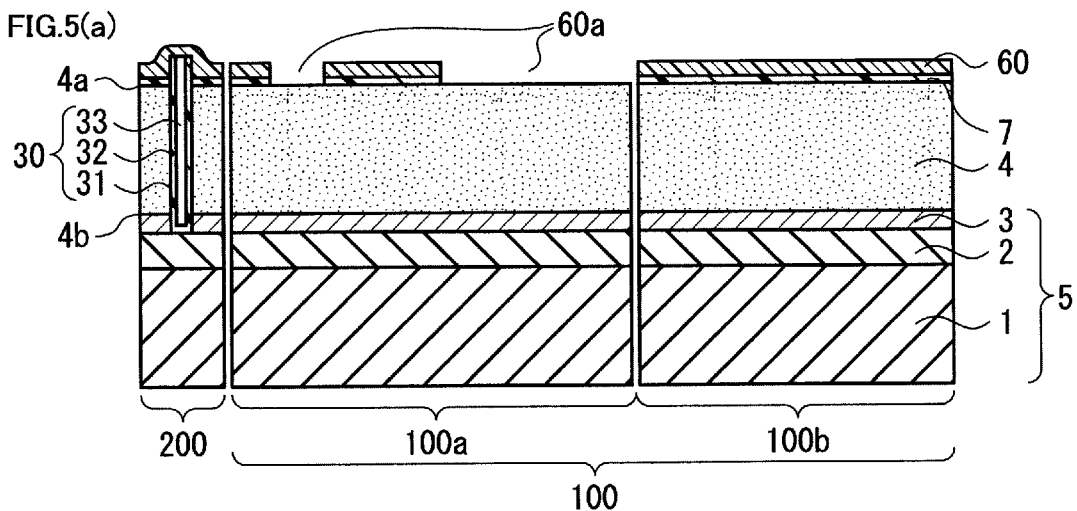
FIG. 5 (a), (b), (c) are a sectional view of the solid-state image pick up device manufactured according to a first embodiment in the present invention.
Figure 5B:
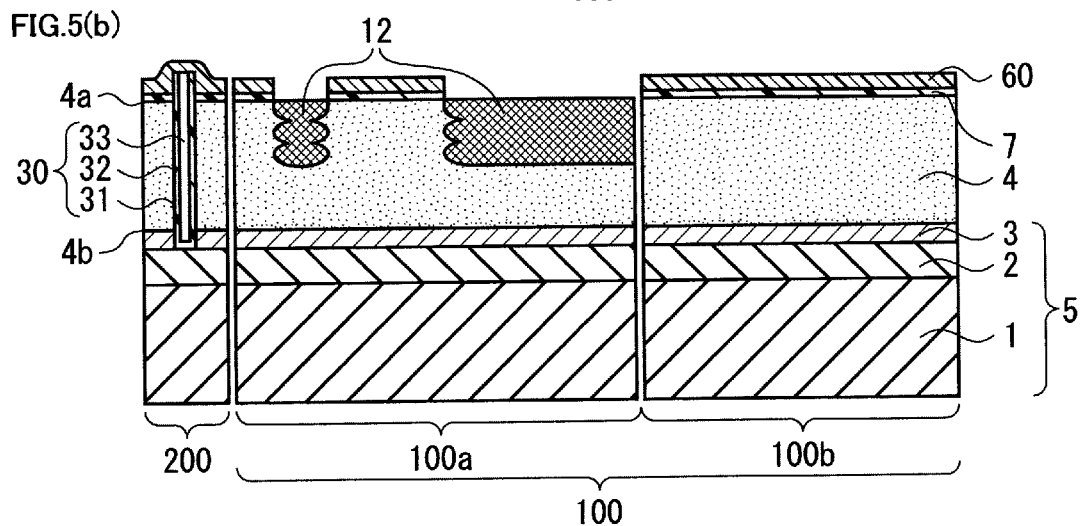
Figure 5C:
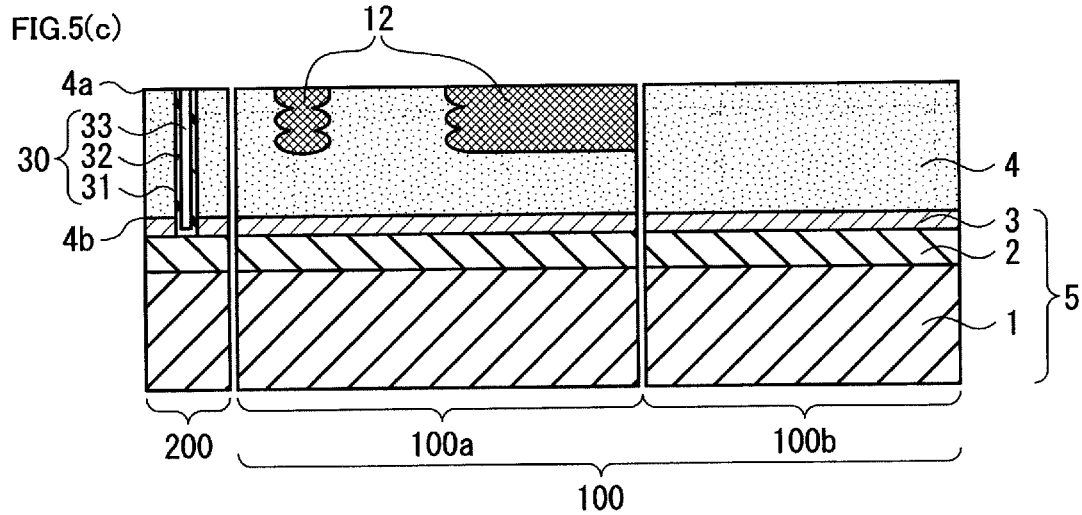

First, as shown in FIG. 5 (a), resist 60 is spread on the silicone oxide layer 7, and an opening 60a is formed in the resist 60 using well-known lithography technology. The opening 60a is formed in a area where the first P type diffusion layer 12 for isolation should be formed. Then, the silicone oxide layer 7 is removed by etching using the resist 60 for a mask. Then, the first surface side 4a of the N type epitaxial layer 4 is exposed.

Then, as shown in FIG. 5 (b), the first P type diffusion layer 12 is formed in the area where the N type epitaxial layer 4 exposed by high velocity ion implantation. The first P type diffusion layer 12 is formed by implanting boron, the density is about 10E11 to 10E13 cm-2, seamlessly accelerated by 100 kev to 3 Mev. At this time, the upper limit of the acceleration energy given to the ion to drive in is decided by the performance of an ion implantation equipment, productivity, a mask process, etc., and 3 Mev or less are suitable for it.

The depth of the first P type diffusion layer 12 is decided by combination of the thickness of the N type epitaxial layer 4, and the acceleration energy of the ion to implant. In this embodiment, the thickness of the first P type diffusion layer 12 is the half or a little deeper position of thickness of the N type epitaxial layer 4.

Then, as shown in FIG. 5 (c), resist 60 and the silicone oxide layer 7 are removed one by one. Then, as shown in FIG. 6 (a), a resist is formed again on the first surface side 4a of the N type epitaxial layer 4. And using well-known lithography technology, an opening is formed in an area of the peripheral circuit area 100b where NMOSFET is formed. Then, the P type semiconductor well 20 is formed by implanting boron to the first surface side 4a of the epitaxial layer 4 from the opening. Then, after removing the disused resist, a resist is formed again and an opening is formed in an area where PMOSFET is formed. Then, the N type semiconductor well 21 is formed by implanting phosphorus to the first surface side 4a of the epitaxial layer 4 from opening.

Then, as shown in FIG. 6 (b), the gate insulation film 16 is formed in the image sensor area 100a and peripheral circuit area 100b. Next, the isolation film 22 is formed in a boundary section of the P type semiconductor well 20 and the N type semiconductor well 21. The isolation film 22 is formed by forming a trench in a boundary section of the P type semiconductor well 20 and the N type semiconductor well 21, and burying an insulating film such as silicon oxide into the trench.

Then, after forming the isolation film 22, the transfer gate electrode 17a for NMOSFET and the reset gate electrode 17b are formed on the first surface side 4a of the N type epitaxial layer 4 through the gate insulating film 16. The gate electrode 27c of PMOSFET and the gate electrode 27d of NMOSFET are formed respectively on the P type semiconductor well 20 and the N type semiconductor well 21 of the PMOSFET of the peripheral circuit area 100b through the insulating film 16. These gate electrode 17a, 17b, 27c, 27d are formed by polysilicon patterning using well-known lithography technology and dry-etching technology.

Then, as shown in FIG. 6 (c), the photo-conversion area 10, the first P type shield layer 14 for preventing the dark current, the source/drain 15a,15b, etc. are formed one by one in the image sensor area 100a. The N type photo-conversion area 10 is formed, using the transfer gate electrode 17a for a mask, in the first surface side 4a of the N type epitaxial layer 4 which surrounded by the isolation area 11. The first P type shield layer 14 is formed on a part of the photo-conversion area 10 of the first surface side 4a of the N type epitaxial layer 4, including a surface except for the surface of the side of the transfer gate electrode 17a and a surface of the first P type diffusion layer 12. The source/drain 15a, 15b of NMOSFET is formed, using the transfer gate electrode 17a and the reset gate electrode 17b for a mask, on the surface of the isolation area 12.

Moreover, a surface of the P type semiconductor well 20 of the peripheral circuit area 100b forms source/drain 23c for PMOSFET. A surface of the N type semiconductor well 21 of peripheral circuit area 100b forms source/drain 24d for NMOSFET one by one. The source/drain 23c for NMOSFET is formed by using the gate electrode 27c for a mask. The source/drain 24d for PMOSFET is formed by using the gate electrode 27d for a mask.

Figure 7A:
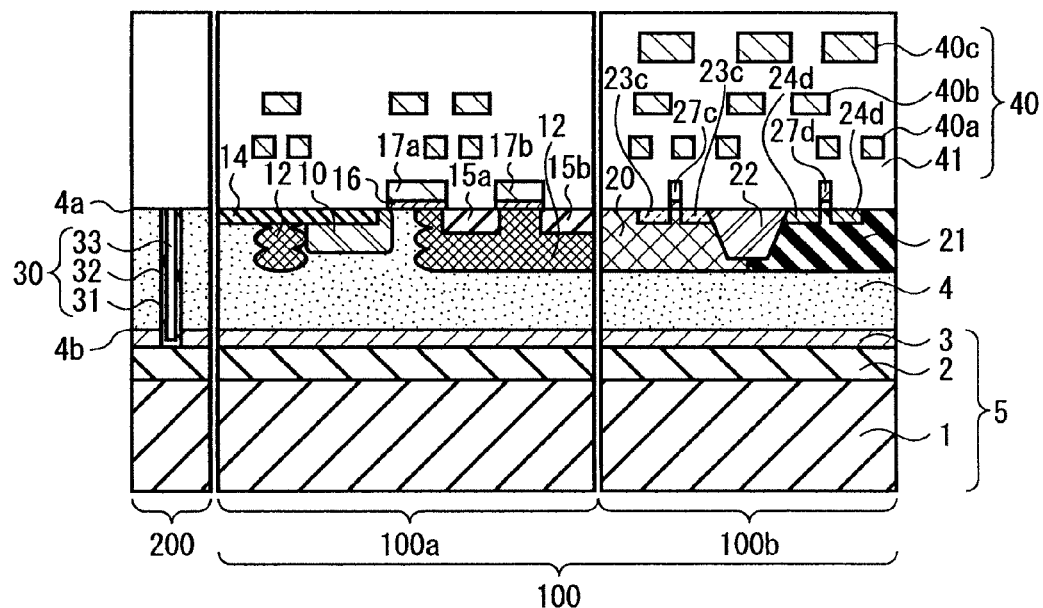
FIG. 7 (a), (b), (c) are a sectional view of the solid-state image pick up device manufactured according to a first embodiment in the present invention.
Figure 7B:
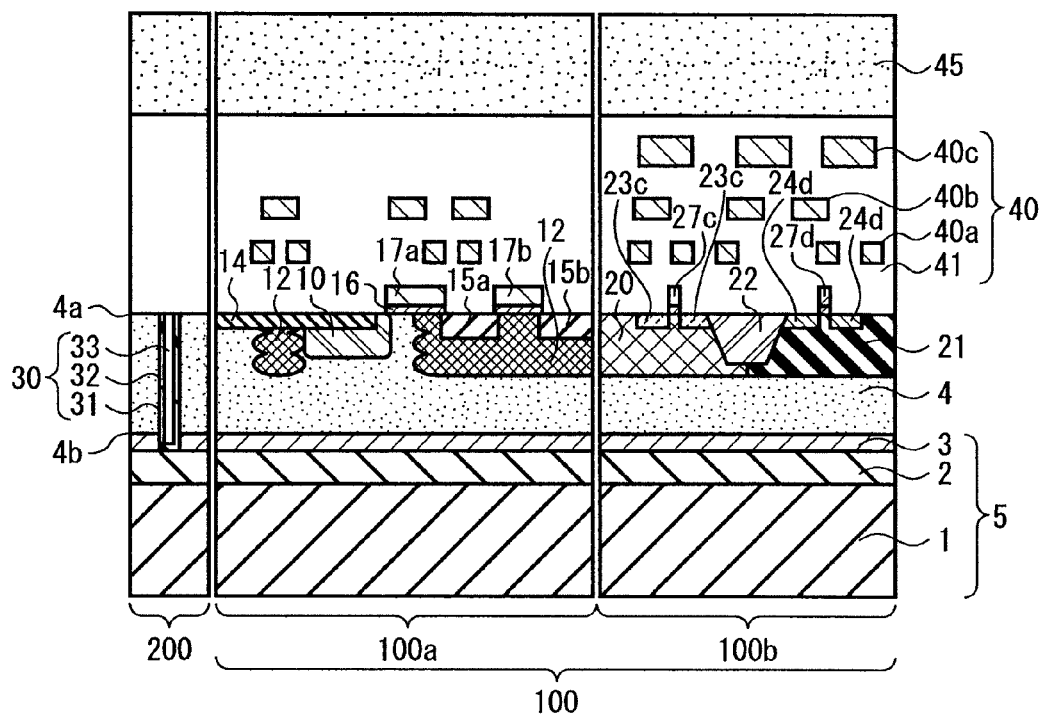
Figure 7C:
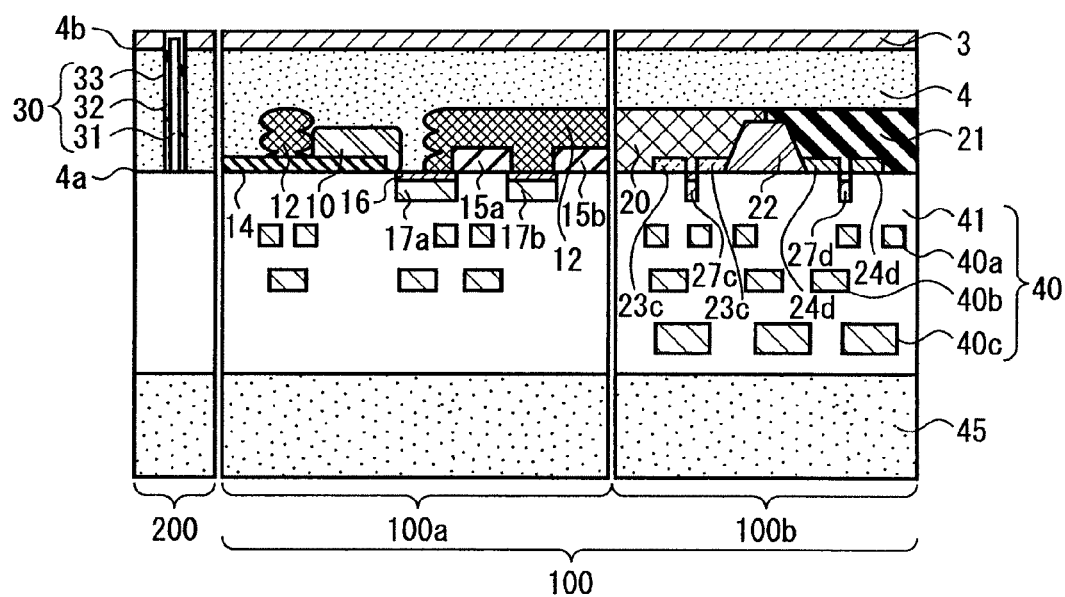

Then, as shown in FIG. 7 (a), the interconnect layer 40 is configured on the first surface side 4a of the N type epitaxial layer 4 by well known multilayer interconnect process. The interconnect layer 40 comprises such as a first interconnect 40a, a second interconnect 40b, a third interconnect 40c, and a interlayer insulation film 41 which is configured by such as a silicon oxide film and a silicon nitride film. Moreover, these interconnect 40a-40c are connected electrically to such as a photodiode and each MOSFET appropriately.

Then, as shown in FIG. 7 (b), an adhesion layer (not shown) by silicon oxide film is formed on a surface of the interconnect layer 40 which is opposite side of the N type epitaxial layer 4. A surface of the adhesion layer is polished by flatness Polishing. Then, a support substrate 45 which comprising an adhesion layer (not shown) by silicon oxide film and the interconnect layer 40 are adhered together wherein the adhesion layer of the interconnect layer 40 and the adhesion layer of the support substrate 45 are opposed together.

Then, as shown in FIG. 7 (c), the SOI substrate 5 and the support substrate 45 are reversed up and down. The SOI substrate 5 is set upper side. The semiconductor substrate 1 and the BOX layer 2, which are back side material, are removed by CMP or wet-etching by HF solution. Then the SOI layer 3 is opened. At this time, the bottom of the trench 31, which is located on the surface of the SOI layer 3, is opened to the surface of the SOI layer 3 without being etched even in case of wet-etching by HF solution because the bottom of the trench 31 is covered by the etching-resistant film 32.

Figure 8A:
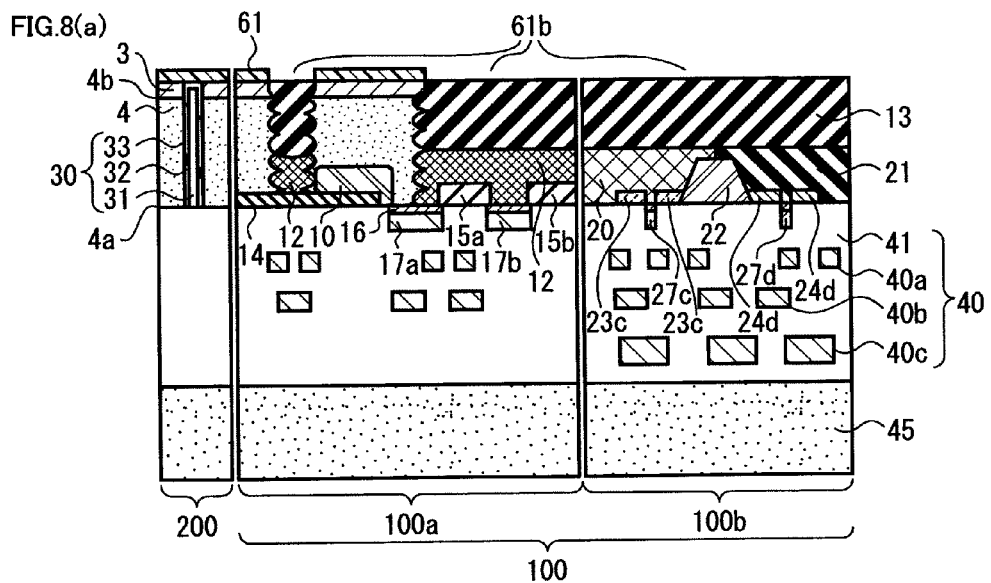
FIG. 8 (a), (b), (c) are a sectional view of the solid-state image pick up device manufactured according to a first embodiment in the present invention.
Figure 8B:
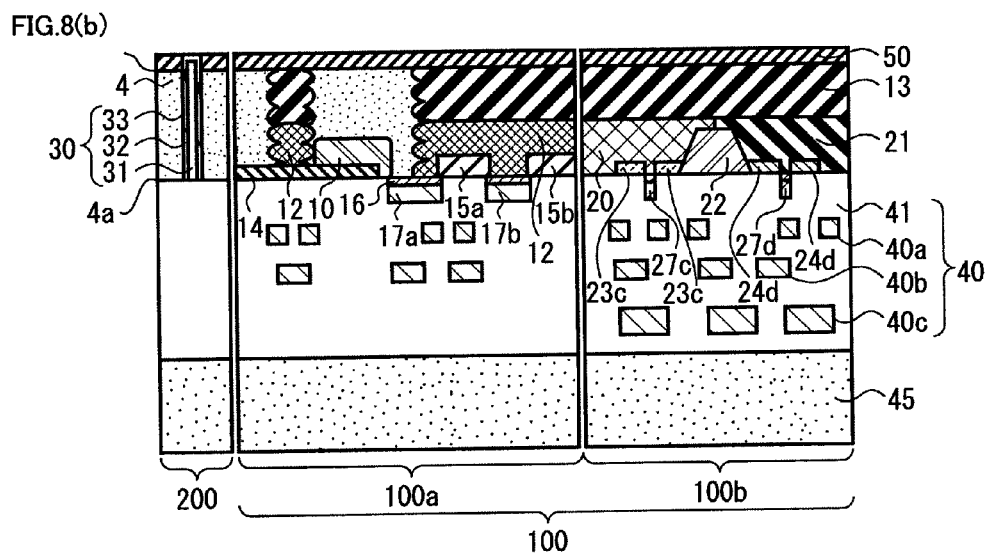
Figure 8C:
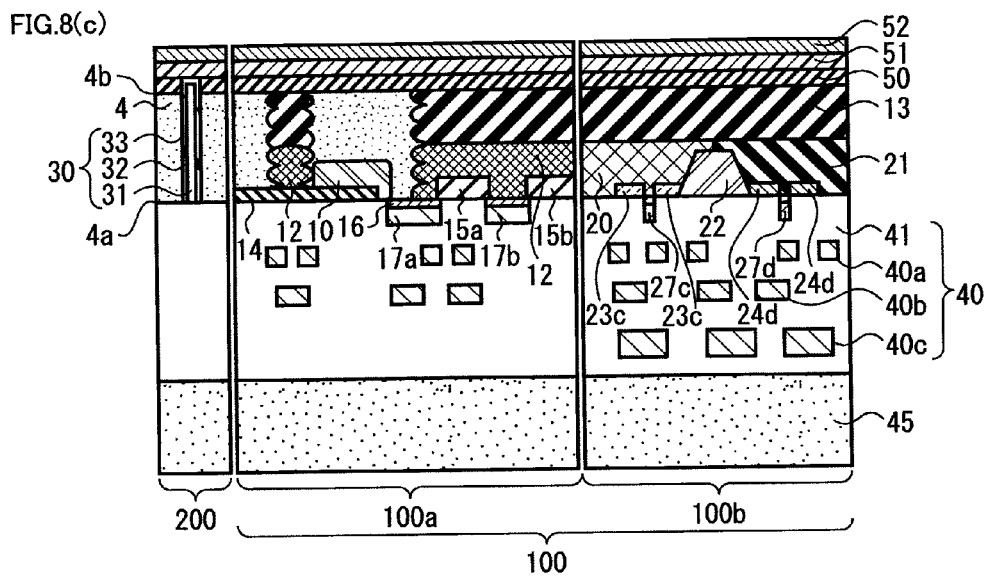

Then, as shown in FIG. 8 (a), after spreading a resist 61 on the SOI layer 3, an opening portion 61a is formed in the resist 61 by well known lithography technology. The opening portion 61a is formed on an area of the second P type diffusion layer 13 is formed. Then, the second P type diffusion layer 13 is formed by high acceleration ion implantation using the resist 61 for a mask. The high acceleration ion implantation is accomplished by selecting acceleration energy and implanting ion such as boron so as to connect the second P type diffusion layer 13 to the bottom of the first P type diffusion layer. Moreover, the second P type diffusion layer 13 is formed so as to connect the bottom of the P type semiconductor well 20 and the bottom of the N type semiconductor well 21 respectively in the peripheral circuit area 100b.

Thus, a noise-resistant for the peripheral circuit 100b is improved by connecting the second P type diffusion layer 13 to the P type semiconductor well 20 and the N type semiconductor well 21 respectively in the peripheral circuit area 100b.

Then, as shown in FIG. 8 (b), after removing the resist 61, the P type shield layer 50 is formed for preventing a dark current on the whole surface of the second surface side 4b of the epitaxial layer 4. Next, as shown in FIG. 8 (c), the amorphous silicon layer 51, wherein boron is doped in a high density, is formed on the whole surface of the second P type shield layer 50. Then, the first insulated film 52 is formed on the whole surface of the amorphous silicon layer 51.

Figure 9:
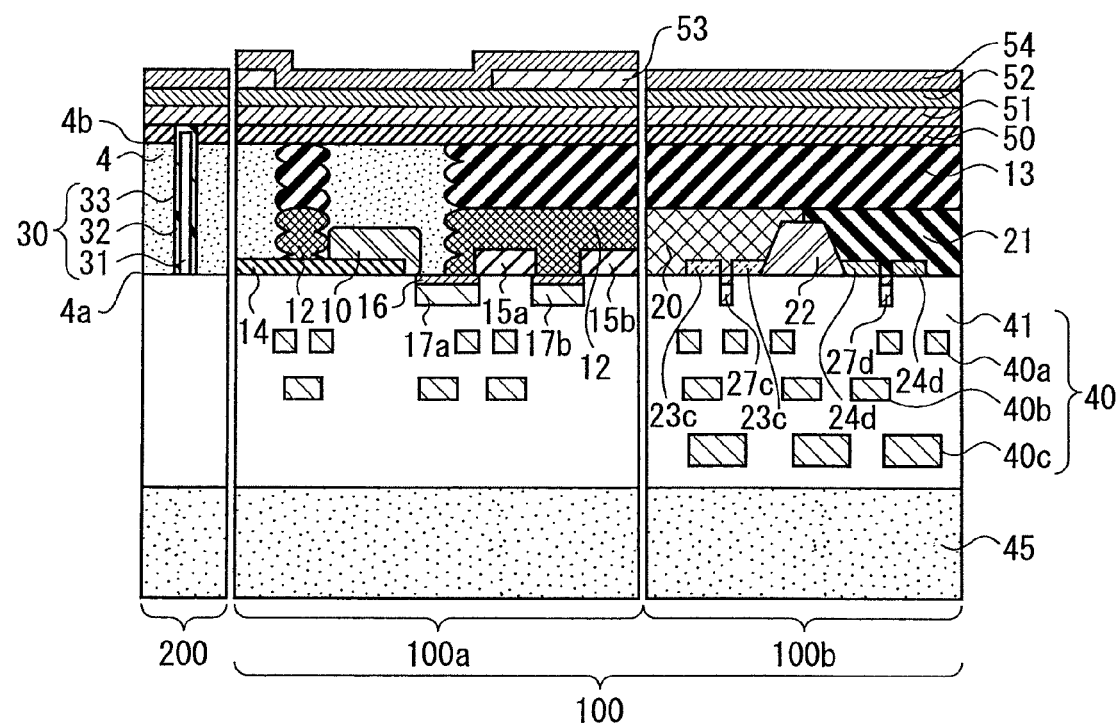
FIG. 9 is a sectional view of the solid-state image pick up device manufactured according to a first embodiment in the present invention.

The second P type shield layer 50 and the amorphous silicon layer 51 only have to be formed at least on the whole surface of the image sensor area 100a. As shown in FIG. 9, after forming the photo-shielding layer 53 on a prescribed position of the first insulated film 51, the second insulated film 54 and the photo-shielding layer 53 are formed on the first insulated film 52. The photo-shielding layer 53 is formed so as to shade a peripheral area of an opening area, which is formed in order to open an area on the N type light receiving area 10. The photo-shielding layer 53 can be formed along the edge of the image sensor area 100a uniformly. The photo-shielding layer 53 can be formed to cover the periphery of the each image device.

Therefore, the sensitivity of the image sensor device can be improved by choosing a refraction of the first insulated film 52 and the second insulated film 53 appropriately in the image sensor area 100a.

Furthermore, a crosstalk caused by an electron leakageed from an adjacent photo-conversion area can be prevented by forming the photo-shielding layer 53 to surround the peripheral area of the each image sensor.

Then, the color filter 55 is formed on a prescribed position of the second insulated film 30. The micro lens 56 is formed on the color filter 53. The solid-state image pickup device as shown in FIG. 1 is formed by above mentioned process.

According to this embodiment, the photo-conversion area 10 is formed by ion implantation, wherein the ion is implanted to the first surface 4a of the N type epitaxial layer 4. The micro lens is formed on the second surface 4b side of the N type epitaxial layer 4. Therefore, in appearance, the photo-conversion area 10 is formed in a deep part of the N type epitaxial layer 4. The isolation area 11 is formed by the first P type diffusion layer 12 and the second P type diffusion layer 13, wherein the first P type diffusion layer is formed by ion implantation implanted to the first surface 4a and the second P type diffusion layer 13 is formed to reach to the bottom of the first diffusion layer 12 by ion implantation implanted to the second surface 4b.

Therefore, the upper limit, that is a problem for high accelerated ion implantation, of the acceleration energy, which is decided by the performance of an ion implantation equipment, productivity, a mask process, etc, is no problem. Then, for example, the N type photo-conversion area 10 can be formed uniformly in density and in a far position from a lens (in view of the lens side that is the side of the second surface 4b side, deep part). The light of the red wavelength is absorbed surly. The isolation area 11 can be formed to reach to the second surface 2 from the first surface of the N type epitaxial layer 4. Moreover, the first P type diffusion layer 12 and the second P type diffusion layer 13, which configure isolation area, can be formed in a middle depth position of the N type epitaxial layer 4. An extension to horizontal direction of the surface of the N type epitaxial layer 4 can be reduced, and then the area of the photo-conversion area 10 can not be reduced. Therefore, a sensor performance of the solid-state image sensor can be improved.

Moreover, until recently, the alignment signal is detected making use of the boundary of a buried layer and an N type epitaxial layer, but the occasion where the BOX layer 3 is removed, also the silicon oxide film which is embedded to the trench 31 is etched. Thus, the boundary of the silicon oxide film and the N type epitaxial layer is disordered. Then, there was a possibility that the function as the alignment mark becomes insufficient. On the contrary, in case of this embodiment, when the BOX layer 3 is removed with HF solution, by covering at least bottom of inner walls of the trench 31 of the alignment mark 30 with the etching-resistant film 32 which has HF-resistance, the bottom of the trench 31 is not etched, and the boundary of the buried layer 33 and an inside the etching-resistant film 32 is not disordered, then, alignment could be more accurate.

Moreover, the amorphous silicon layer 51 functions as gettering site for the metal contamination. Especially, because of the amorphous silicon layer 51 is arranged on the back side where the micro lens 56 is arranged, there is no need for removing the gettering site once formed, then, a gettering effect for metal contamination in heat process could be improved, and a decrease of the noise by dark current could be attempted.

Second Embodiment

Figure 11:
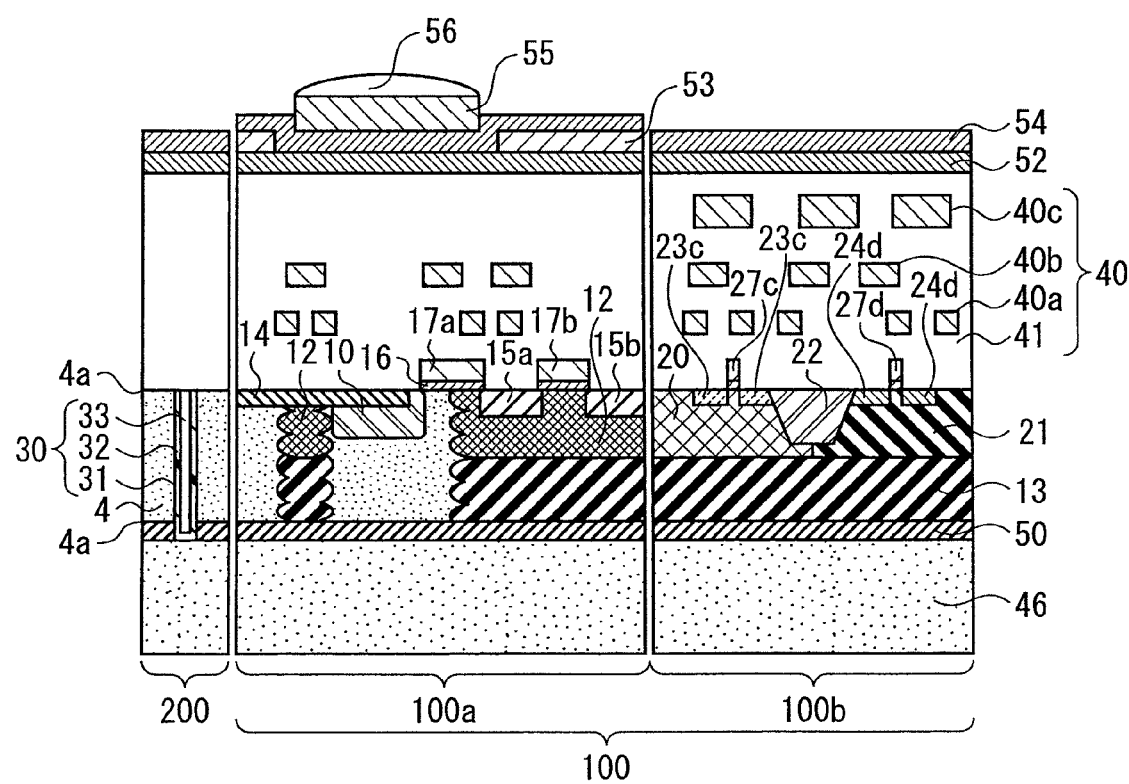
FIG. 11 is a sectional view of the solid-state image pick up device manufactured according to a second embodiment in the present invention.

FIG. 11 is a sectional view of the solid-state image pick up device for the second embodiment. A difference from the first embodiment is that the first embodiment is for backside illuminated solid-state image devise and the second embodiment is for front side illuminated solid-state image devise.

Figure 10A:
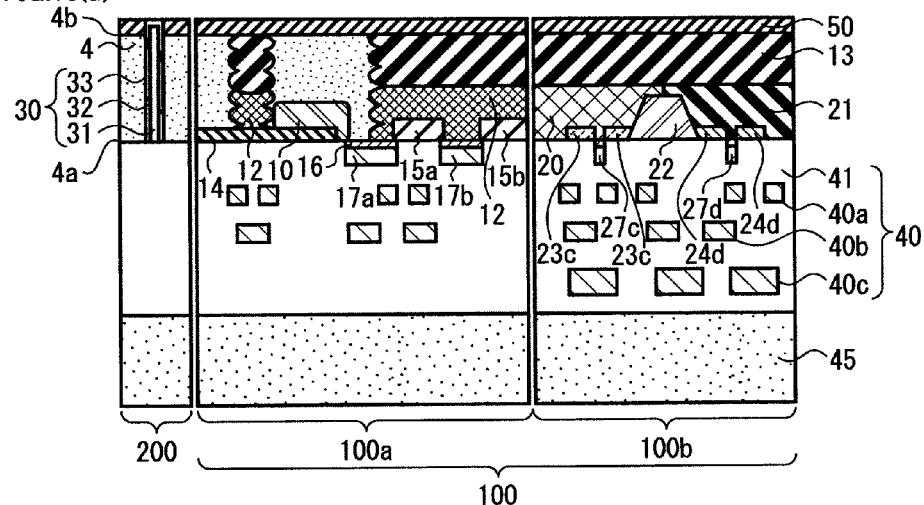
FIG. 10 (a), (b), (c) are a sectional view of the solid-state image pick up device manufactured according to a second embodiment in the present invention.
Figure 10B:
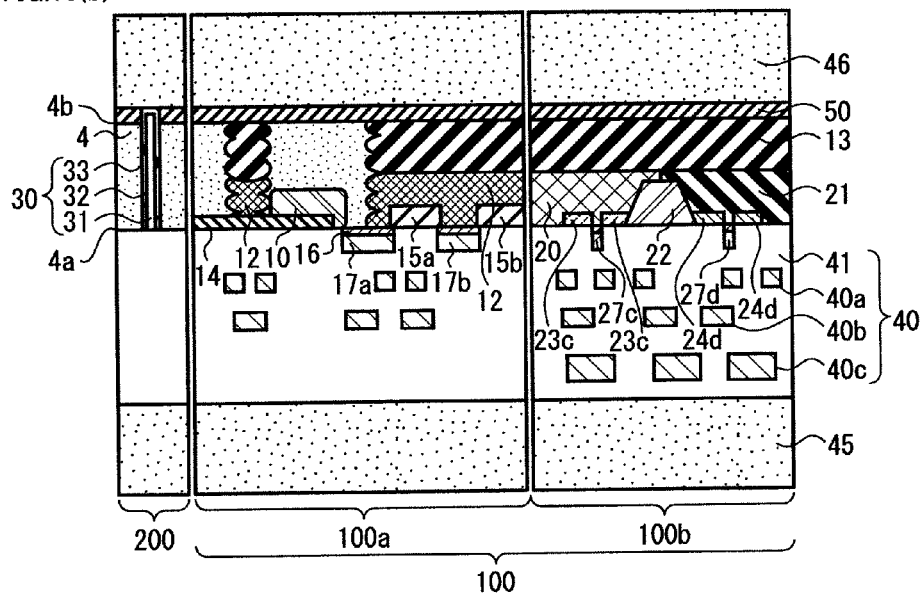
Figure 10C:
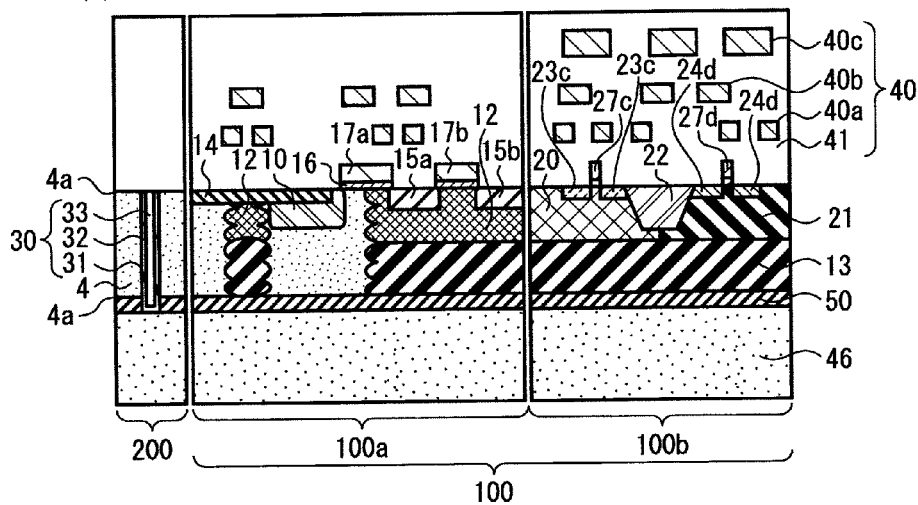

Concretely, as shown in FIG. 10 (a), the manufacturing method until FIG. 8 (b) for the first embodiment, where the second P type shield layer 26 is formed, is the same. However, the alignment mark 30 formed in the first embodiment may not be formed.

Then, as shown in FIG. 10 (b), a adhesion layer (not shown) by silicon oxide film is formed on a surface of the second P type shield layer 50, the adhesion layer is polished by flatness polishing, then, the support substrate 45 which comprising an adhesion layer (not shown) by silicon oxide film is adhered together wherein the adhesion layers are opposed together so that the second P type shield layer 50 and the support substrate 45 are sticked together.

Then, as shown in FIG. 10 (c), the second support substrate 46 and the first support substrate 45 are reversed up and down. That is, the second support substrate 46 is set to the lower side and the first support substrate 45 is set to the upper part. The first substrate 45 is removed by CMP or wet-etching by HF solution. Then the SOI layer 3 is opened.

Then, as shown in FIG. 11, the amorphous silicon layer 51, the first insulating film 52, photo-shielding layer 53, the second insulating film 54, color filter 55 and micro lens 56 are formed on the interconnect layer 40 one by one described in the first embodiment.

According to this embodiment, The isolation area 11 is formed by the first P type diffusion layer 12 and the second P type diffusion layer 13, wherein the first P type diffusion layer is formed by ion implantation implanted to the first surface 4a and the second P type diffusion layer 13 is formed to reach to the bottom of the first diffusion layer 12 by ion implantation implanted to the second surface 4b.

Therefore, the upper limit, that is a problem for high accelerated ion implantation, of the acceleration energy, which is decided by the performance of an ion implantation equipment, productivity, a mask process, etc, is no problem. Then, the isolation area 11 can be formed to reach to the second surface 2 from the first surface of the N type epitaxial layer 4. Moreover, the first P type diffusion layer 12 and the second P type diffusion layer 13, which configure isolation area, can be formed in a middle depth position of the N type epitaxial layer 4. An extension to horizontal direction of the surface of the N type epitaxial layer 4 can be reduced, and then the area of the photo-conversion area 10 can not be reduced. Therefore, a sensor performance of the solid-state image sensor can be improved.

Third Embodiment

Figure 12A:
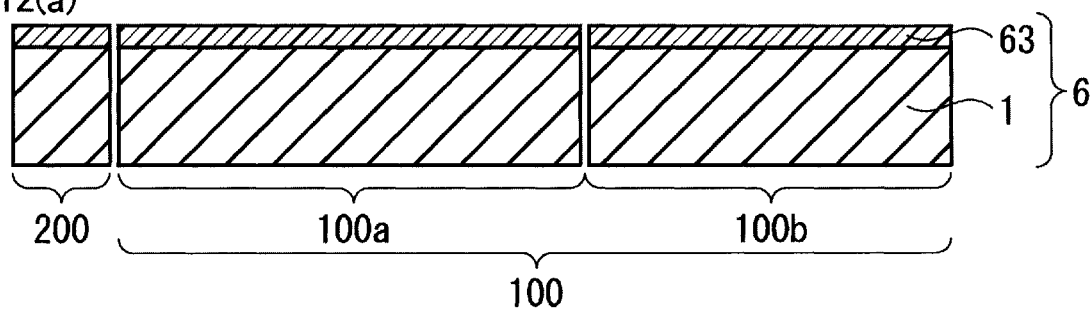
FIG. 12 (a), (b) are a sectional view of the solid-state image pick up device manufactured according to a third embodiment in the present invention.
Figure 12B:
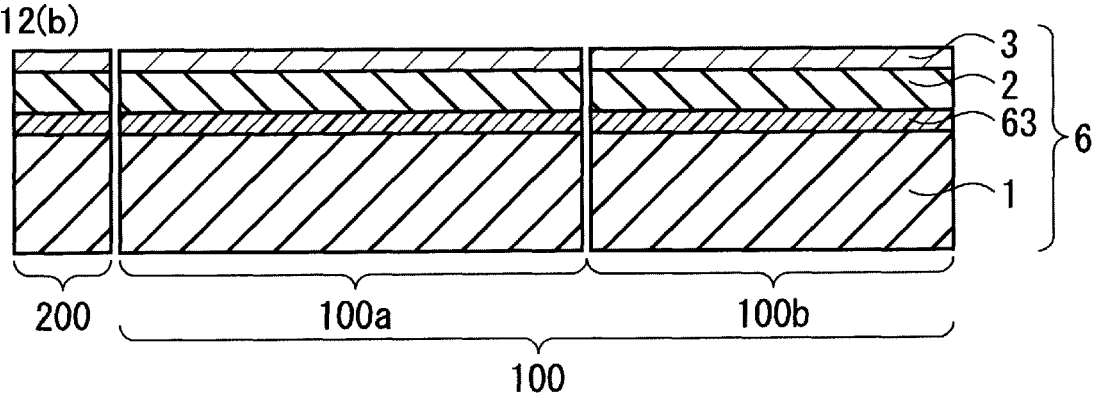

FIGS. 12 (a), and 12 (b) are sectional view of solid-state image pick up device for third embodiment. A difference from first embodiment is that, in case of first embodiment, the SOI substrate 5 comprises the SOI layer 3 through the BOX layer 2 on the semiconductor substrate 1, but in case of third embodiment, SOI substrate 6 comprises the SOI layer 3 on the BOX layer 2 through a second amorphous silicon layer 63 on the semiconductor substrate 1.

As shown in FIG. 12 (a), the amorphous silicon layer 63, which functions as a gettering site against a metal contamination, and, wherein boron is doped in a high density, is formed on the semiconductor substrate 1. Then, as shown in FIG. 12 (b), the BOX layer 2 is formed on the second amorphous silicon 63, and the SOI layer 3 is formed on the BOX layer 2.

The manufacturing process afterwards is similar to the manufacturing process in the form of the first embodiment. In addition, the second amorphous silicon layer 63 is removed when the semiconductor substrate 1 and the BOX layer 2 are removed from the surface of the N type epitaxial layer 4 by such as CMP or wet-etching.

According to this embodiment, because the second amorphous silicon layer 63 is formed at the beginning of the manufacturing process of this solid-state image pick up device 300 besides the effect of the first embodiment, pollution with the heavy metal with the possibility to be generated in the heat process etc. until the second amorphous silicon layer 63 is removed can be prevented, and the effect of prevention from the metal contamination can be improved further. Therefore, the decrease of the noise by the dark current can be attempted compared with the first embodiment.

Fourth Embodiment

Figure 13A:
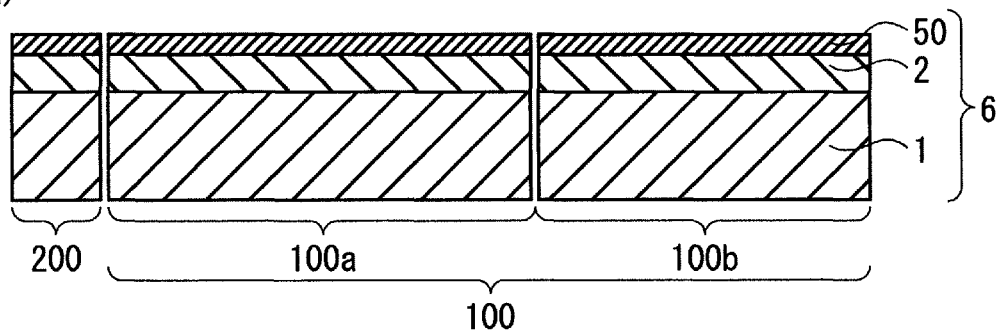
FIG. 13 (a), (b) are a sectional view of the solid-state image pick up device manufactured according to a forth embodiment in the present invention.
Figure 13B:
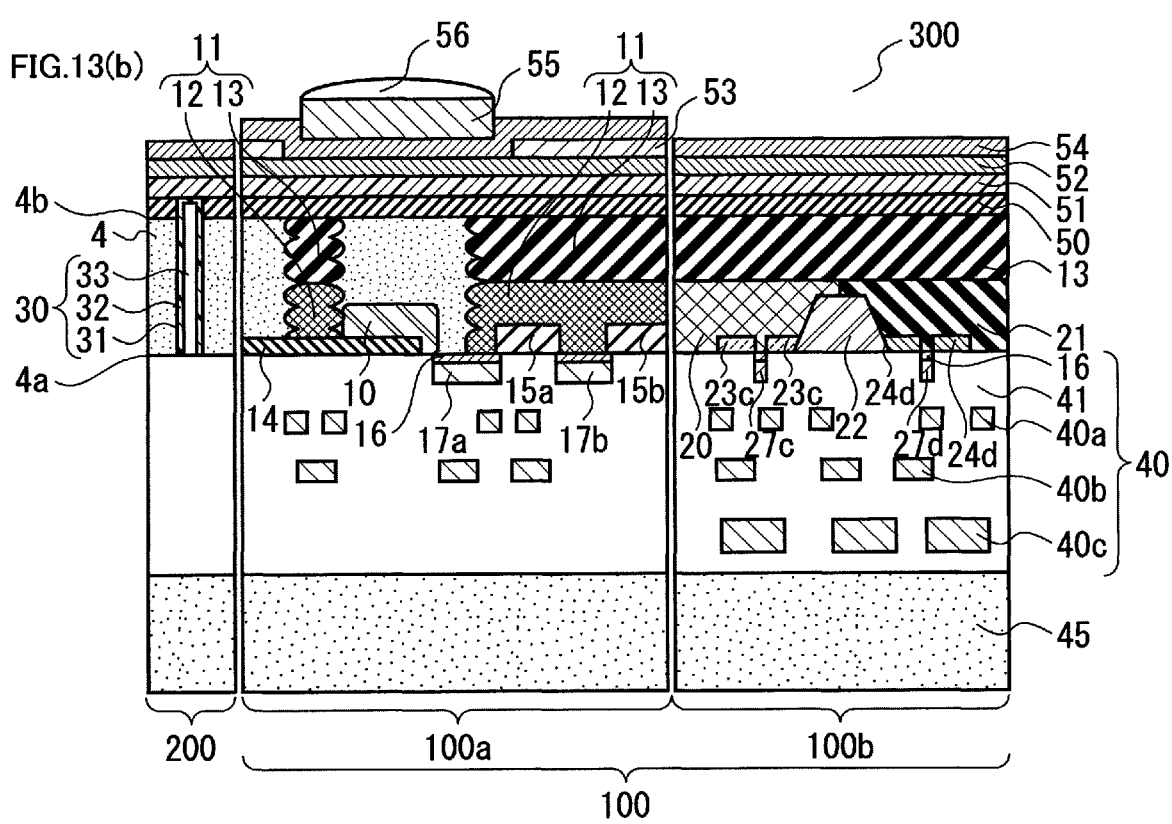

FIG. 13 (a) is sectional view of solid-state image pick up device for forth embodiment. A difference from first embodiment is that, in case of first embodiment, the second P type shield layer 50 is formed after the second P type diffusion layer 13 is formed, but in case of forth embodiment, at the time when the SOI substrate 5 is formed, after forming the BOX layer 2 on the semiconductor substrate 1, the second P type shield layer 50 is formed on the BOX layer 2 instead of forming the SOI layer 3. The solid-state image pickup device shown in FIG. 13 (b) by passing the above-mentioned process is obtained.

According to this embodiment, besides the effect of the first embodiment, because the second P type shield layer is formed on the BOX layer 2 beforehand, as shown in FIG. 8 (b), the manufacturing process for removing the SOI layer 3 could be unnecessary, then, the manufacturing process could be shortened The invention in its broader aspects is not limited to the specific details and representative embodiments shown and described herein. Accordingly, various modifications may be made without departing from the spirit or scope of the general inventive concept as defined by the appended claims and their equivalents.

For example, in case of first embodiment, the SOI substrate 5 comprises the BOX layer 2 on the semiconductor substrate 1 and the SOI layer 3 on the BOX layer 2, but it would be allowable that the SOI layer 5 is formed by sticking the BOX layer 2 and other semiconductor substrate together.

Moreover, the alignment mark 30 is not limited to arrangement of FIG. 2 (b), but other arrangement is also possible for it.

Moreover, the amorphous silicone layer 51, the first insulated film 52, and the second insulated film 54 should be formed at least in the image sensor area 100a at least, but in the peripheral circuit area 100b and in the peripheral area 200 they can be formed arbitrarily.

Moreover, interconnect of the interconnect layer 40 is not restricted to three layers. For example, two layers are allowable and five or more layers are allowable.

Moreover, the MOSFET is not limited to Complementary MOSFET, but PMOSFET or NMOSFET is allowable.

Moreover, the interconnected layer 40 and support substrate 45 could be sticked together by not an adhesion layer but pressing. Moreover, the support substrate 45 should not be semiconductor substrate. It could be anything supportable, for example a glass substrate.

What is claimed is:

1. A method for manufacturing a solid-state image pickup device comprising:
configuring a photo-conversion area, which charges electron by photoelectric conversion, by implanting from a first surface side of a first conduction type semiconductor layer which has the first surface side, a second surface side which is located the opposite side of the first surface side and an image sensor area;

configuring a first diffusion area of second conduction type for isolation, wherein the first diffusion area surrounds the photo-conversion area and extends from the first surface side to the middle part of the semiconductor layer; and configuring a second diffusion area of second conduction type for isolation, wherein the second diffusion area extends from the second surface side to the bottom of the first diffusion layer.

2. A method according to claim 1, further comprising:
configuring an interconnect layer in the first surface side of the semiconductor layer; and
configuring a micro lens in the second surface side of the semiconductor layer.

3. A method according to claim 1, further comprising:
configuring an interconnect layer in the first surface side of the semiconductor layer; and
configuring a micro lens on the micro lens.

4. A method according to claim 2, further comprising:
configuring a trench through the semiconductor layer;
configuring an etching-resistant film to cover an inner wall of the trench and an opening edge of a second surface side of the trench; and
configuring an alignment mark which comprises a buried layer which is buried in the trench with the etching-resistant film.

5. A method according to claim 2, further comprising
configuring a gettering site under the micro lens on the second surface side of the semiconductor layer.

6. A method according to claim 4, further comprising
configuring a gettering site under the micro lens on the second surface side of the semiconductor layer.

7. A method according to claim 1, further comprising;
configuring a BOX layer on the semiconductor layer;
configuring a second conductive type shield layer on the BOX layer; and
configuring the semiconductor layer by epitaxial growth on the second shield layer.

8. A method for manufacturing a solid-state image pickup device comprising:
configuring a BOX layer on a first support substrate which comprise an image sensor area and a peripheral area;
configuring a SOI layer of first conduction type on the BOX layer;
configuring an epitaxial layer on the SOI layer;
configuring a first diffusion layer of second conduction type in the image sensor area selectively, wherein the first diffusion layer extends from a first surface side, which is located to the opposite side of a second surface side adjacent to the SOI layer in the surface of the epitaxial layer in the image sensor area, to approximately a half thickness of the epitaxial layer where a bottom of the first diffusion layer is positioned to;
configuring a gate electrode on the first surface side through a gate insulating film;
configuring a source, a drain, a first shield layer of second conduction type and a photo-conversion area of first conduction type selectively in the first surface of the epitaxial layer of the image sensor area;
configuring a interconnect layer, which comprising a wire and a interlayer insulation film, on the first surface of the epitaxial layer of first conduction type;
configuring a second support substrate on the interconnect layer;
exposing the SOI layer by removing the first support substrate and the BOX layer;
configuring a second diffusion layer of second conduction type, which extends from the exposing surface side of the SOI layer adjacent to the bottom of the first diffusion layer;
configuring a photo-shielding layer on the second surface side of the epitaxial layer at least in the image sensor area, wherein the photo-shielding layer is covering a peripheral part of the photo-conversion area; and
configuring a micro lens on the second surface side of the photo-conversion area.

* * * * *